(12) United States Patent
Tigelaar et al.

(10) Patent No.: US 7,198,993 B2
(45) Date of Patent: Apr. 3, 2007

(54) METHOD OF FABRICATING A COMBINED FULLY-DEPLETED SILICON-ON-INSULATOR (FD-SOI) AND PARTIALLY-DEPLETED SILICON-ON-INSULATOR (PD-SOI) DEVICES

(75) Inventors: Howard L. Tigelaar, Allen, TX (US); Gabriel G. Barna, Richardson, TX (US); Olivier Alain Faynot, Seyssinet (FR)

(73) Assignee: Texas Instruments Incorporated, Dallas, TX (US)

( * ) Notice: Subject to any disclaimer, the term of this patent is extended or adjusted under 35 U.S.C. 154(b) by 291 days.

(21) Appl. No.: 11/010,849

(22) Filed: Dec. 13, 2004

(65) Prior Publication Data

US 2006/0128074 A1    Jun. 15, 2006

(51) Int. Cl.
  *H01L 21/84* (2006.01)
  *H01L 27/12* (2006.01)
(52) U.S. Cl. .................... 438/151; 438/197; 438/211; 438/257; 438/311; 438/E21.179; 257/347; 257/638; 257/E29.129; 257/E29.3; 257/E21.422; 257/E27.112

(58) Field of Classification Search .................... None
See application file for complete search history.

(56) References Cited

U.S. PATENT DOCUMENTS

| | | | |
|---|---|---|---|
| 6,222,234 B1* | 4/2001 | Imai ........................... | 257/347 |
| 6,403,435 B1* | 6/2002 | Kang et al. .................. | 438/311 |
| 6,461,907 B2* | 10/2002 | Imai ........................... | 438/217 |
| 6,537,891 B1* | 3/2003 | Dennison et al. ........... | 438/406 |
| 6,818,496 B2* | 11/2004 | Dennison et al. ........... | 438/239 |
| 6,835,983 B2* | 12/2004 | Ning et al. .................. | 257/347 |
| 6,876,039 B2* | 4/2005 | Okihara ....................... | 257/350 |
| 7,005,706 B2* | 2/2006 | Hiraizumi .................... | 257/348 |
| 7,045,398 B2* | 5/2006 | Yasukawa .................... | 438/149 |
| 2001/0005030 A1* | 6/2001 | Imai ........................... | 257/348 |
| 2004/0180478 A1 | 9/2004 | Yang et al. | |
| 2004/0217420 A1 | 11/2004 | Yeo et al. | |
| 2004/0217775 A1 | 11/2004 | Turner | |

* cited by examiner

*Primary Examiner*—Alonzo Chambliss
(74) *Attorney, Agent, or Firm*—Peter K. McLarty; W. James Brady, III; Frederick J. Telecky, Jr.

(57) ABSTRACT

A method (100) of forming fully-depleted (90) and partially-depleted (92) silicon-on-insulator (SOI) devices on a single die in an integrated circuit device (2) is disclosed using SOI starting material (4, 6, 8) and a selective epitaxial growth process (110).

14 Claims, 6 Drawing Sheets

METHOD OF FABRICATING A COMBINED FULLY-DEPLETED SILICON-ON-INSULATOR (FD-SOI) AND PARTIALLY-DEPLETED SILICON-ON-INSULATOR (PD-SOI) DEVICES

FIELD OF INVENTION

The present invention relates generally to semiconductor devices and more particularly to methods for fabricating fully-depleted and partially-depleted SOI devices in an integrated circuit.

BACKGROUND OF THE INVENTION

Semiconductor device geometries have dramatically decreased in size since such devices were first introduced several decades ago. The desire for higher performance circuits has driven the development of high-speed sub-100 nanometer (nm) silicon-on-insulator (SOI) complementary metal-oxide-semiconductor (CMOS) technology. In SOI technology, metal-oxide semiconductor field-effect transistors (MOSFETs) are formed on a thin layer of silicon overlying a layer of insulating material such as silicon oxide. Devices formed on SOI offer many advantages over their bulk counterparts, including reduced junction capacitance, absence of reverse body effect, soft-error immunity, full dielectric isolation, and absence of latch-up. SOI technology therefore enables higher speed performance, higher packing density, and reduced power consumption.

There are two types of conventional SOI devices: partially-depleted SOI (PD-SOI) devices, and fully-depleted (FD-SOI) devices. A conventional PD-SOI transistor device is one in which the silicon body thickness is thicker than the maximum depletion layer width in the silicon during device operation, and a conventional FD-SOI transistor device is one in which the body thickness is thinner than the maximum depletion layer width in the silicon during device operation. Consequently, during operation, the PD-SOI device experiences a "partial" depletion of the silicon body, while the FD-SOI experiences a "full" depletion thereof. The conventional PD-SOI and FD-SOI devices are planar devices and thus are formed in the plane of the wafer.

Each of the PD-SOI and FD-SOI devices have their own respective advantages. For example, while PD-SOI devices have the merit of being highly manufacturable, significant design burdens are experienced due to floating body effects associated therewith. In PD-SOI devices, charge carriers generated by impact ionization near one source/drain region may accumulate near the other source/drain region of the transistor. When sufficient carriers accumulate in the floating body, which is formed right below the channel region, the body potential is effectively altered.

Floating body effects occur in PD-SOI devices because of charge build-up in the floating body region. Such floating body effects can result in kinks in the device current-voltage (I–V) curves, thereby degrading the electrical performance of the circuit. In general, the body potential of a PD-SOI device may vary during static, dynamic, or transient device operation, and is a function of many factors like temperature, voltage, circuit topology, and switching history. Therefore, circuit design using PD-SOI devices must take such factors into account, and accordingly there are certain circuit applications where the floating body effects represent a significant barrier for the adoption of PD-SOI technology.

Another way of avoiding floating body effects in SOI devices is to adopt a fully-depleted SOI (FD-SOI) technology. FD-SOI devices do not suffer from floating-body effects due to the fact that the body is fully-depleted during device operation. FD-SOI technology is therefore relatively design-friendly with respect to floating-body effects. FD-SOI devices are also believed to provide better junction capacitance, lower off-state leakage, fewer soft errors, lower operating voltages and lower gate delay than PD-SOI devices.

Traditionally, in a FD-SOI technology, devices with a low body-doping and/or a thin body thickness are used. Additionally, for good control of short-channel effects, the device body thickness is usually reduced to less than one third of the gate length. SOI substrates with uniform ultra-thin Si films, as required for the manufacture of FD-SOI devices with ultra-thin body, however, are difficult to obtain or fabricate and non-uniformities in the Si film thickness may result in significant fluctuations in the device characteristics and negatively impact the ease of manufacture. In addition, it is difficult to build analog transistors, high voltage I/O transistors, or transistors with different Vt's on the same chip as high performance FD-SOI transistors. These types of transistors are more readily built with PD-SOI.

Consequently, there is a need for a method to form both PD-SOI and FD-SOI devices reliably in a single fabrication process, wherein either device can be employed based on circuit application requirements.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

The present invention relates to a method of forming fully-depleted and partially-depleted SOI devices on a semiconductor device. The use of SOI starting material, along with the use of selective epitaxial growth is utilized to generate different types of SOI devices on the same substrate in a reliable manner. The SOI starting material comprises, in one example, a substrate having a buried oxide (BOX) layer and a first silicon layer (sometimes called the SOI layer) formed thereover, wherein the first silicon layer has a thickness generally associated with a thickness of the fully-depleted SOI device. A dielectric portion, such as a patterned nitride layer, is formed in the fully-depleted SOI region, and a second silicon layer is formed over the device via, for example, selective epitaxial growth, thereby forming a composite silicon layer (comprising the first and second silicon layers) in the partially-depleted region, wherein the composite silicon layer has a thickness generally associated with the partially-depleted SOI device and also increases thickness of the silicon in the source and drain regions of the fully depleted region to reduce resistance.

The method continues by forming a dielectric layer such as an oxide over the device, wherein the dielectric surrounds the nitride in the fully-depleted region and covers the composite silicon layer in the partially-depleted region. The nitride is then removed in the fully-depleted region, and a portion of the oxide is removed in the partially-depleted region to form gate openings, and a conductive material such as polysilicon is then deposited therein to form gate regions of the fully-depleted and partially-depleted SOI devices, respectively.

The following description and annexed drawings set forth in detail certain illustrative aspects and implementations of the invention. These are indicative of but a few of the various ways in which the principles of the invention may be employed.

DETAILED DESCRIPTION OF THE INVENTION

The present invention will now be described with reference to the attached drawing figures, wherein like reference numerals are used to refer to like elements throughout. The invention relates to a method of concurrently forming both fully-depleted and partially-depleted SOI devices on the same substrate, thereby enabling fabrication and use of such devices on the same die.

Figure 1:
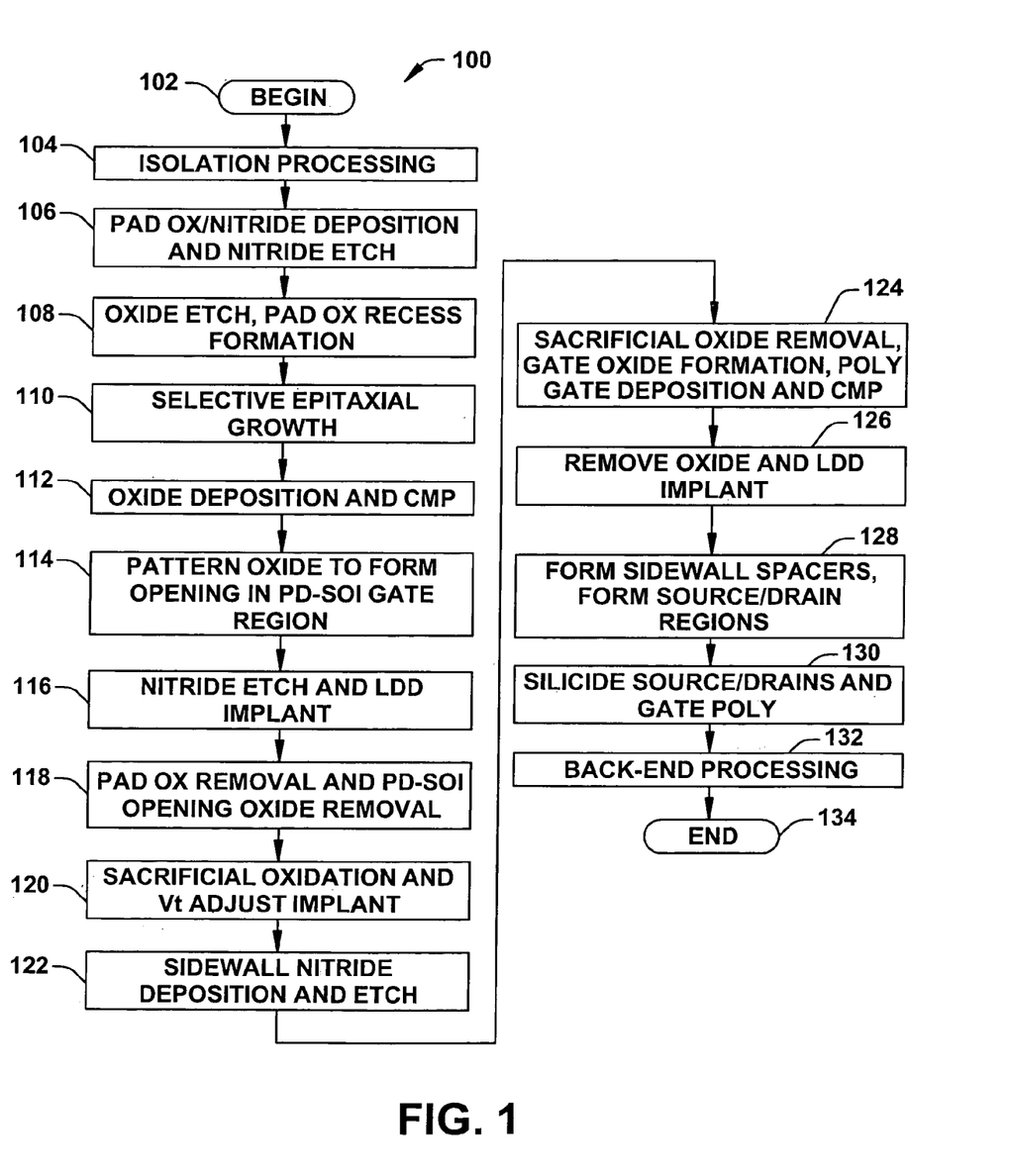
FIG. 1 is a flow diagram illustrating a process for fabricating a semiconductor device having both PD-SOI and FD-SOI devices according to one aspect of the present invention.
Figure 2A:
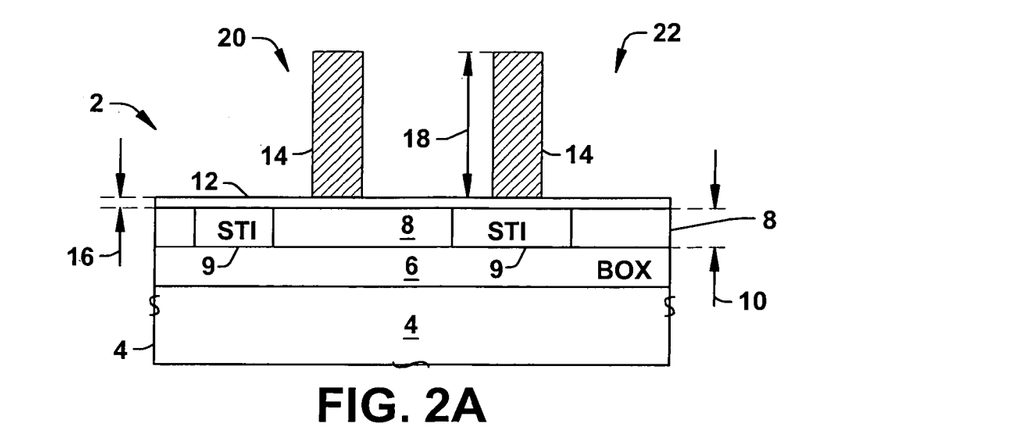
FIGS. 2A–2O are partial side elevation views in section illustrating formation of a semiconductor device having both PD-SOI and FD-SOI devices thereon generally according to the fabrication process of FIG. 1 in accordance with the invention.
Figure 2B:
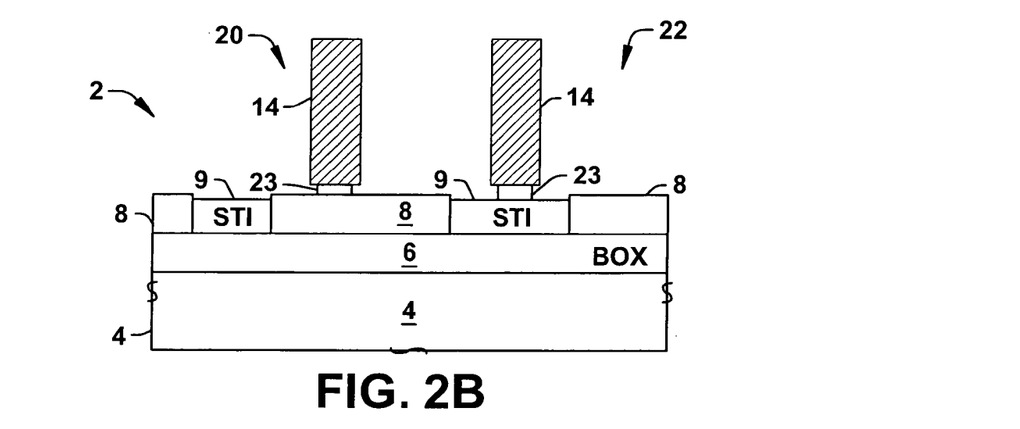
Figure 2C:
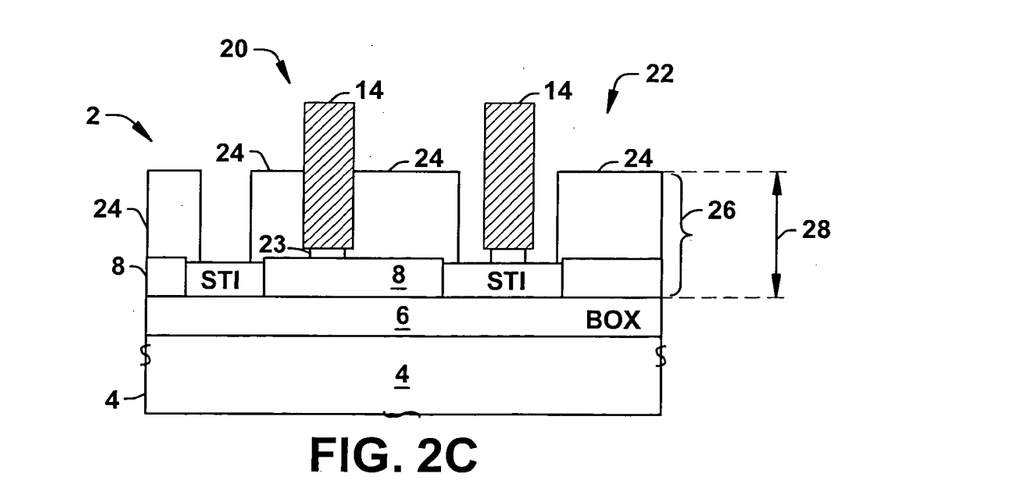
Figure 2D:
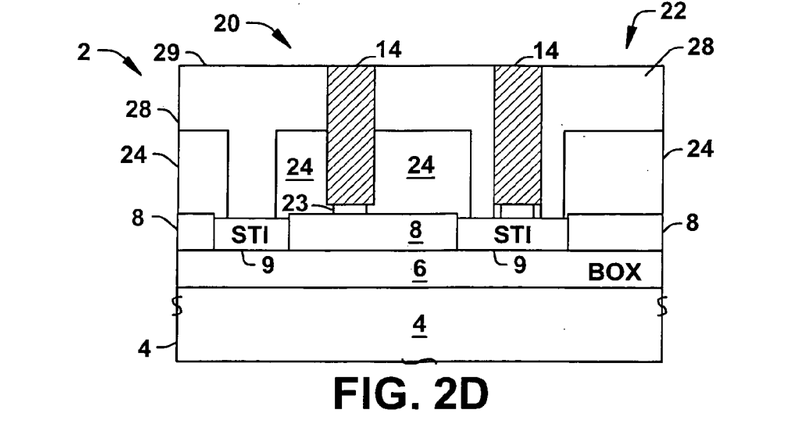
Figure 2E:
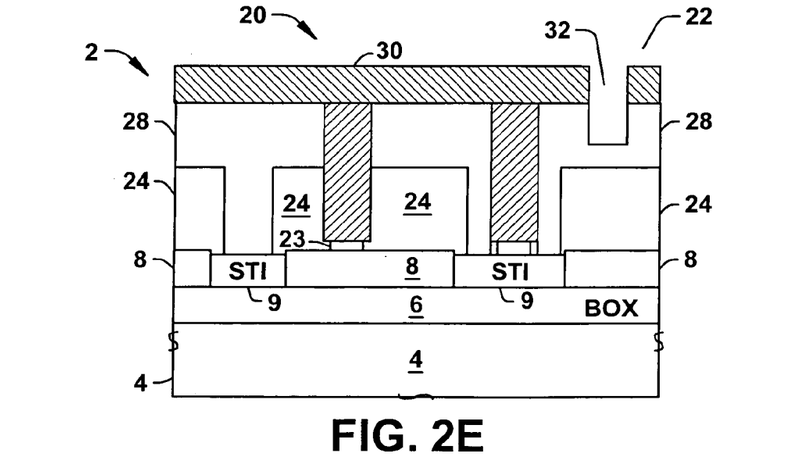
Figure 2F:
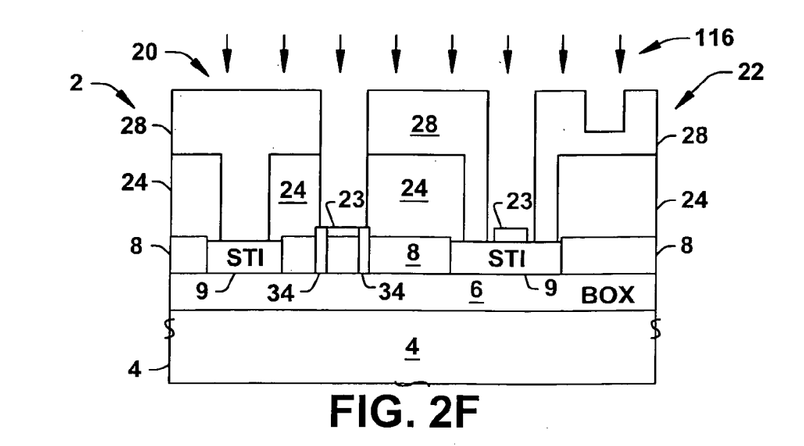
Figure 2G:
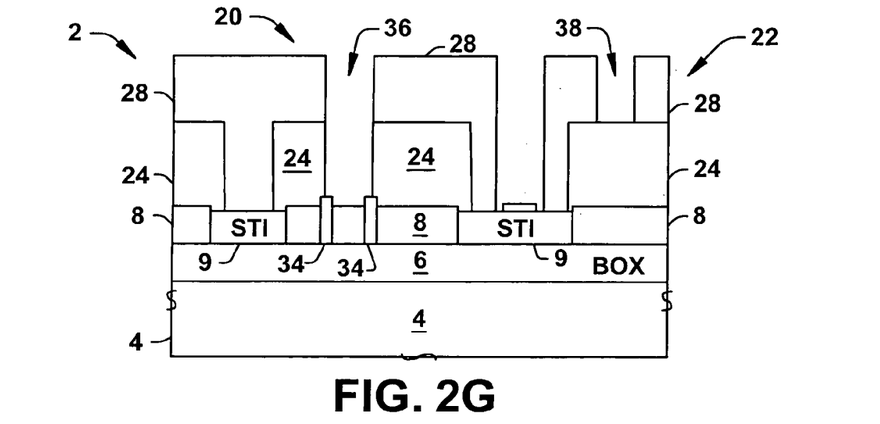
Figure 2H:
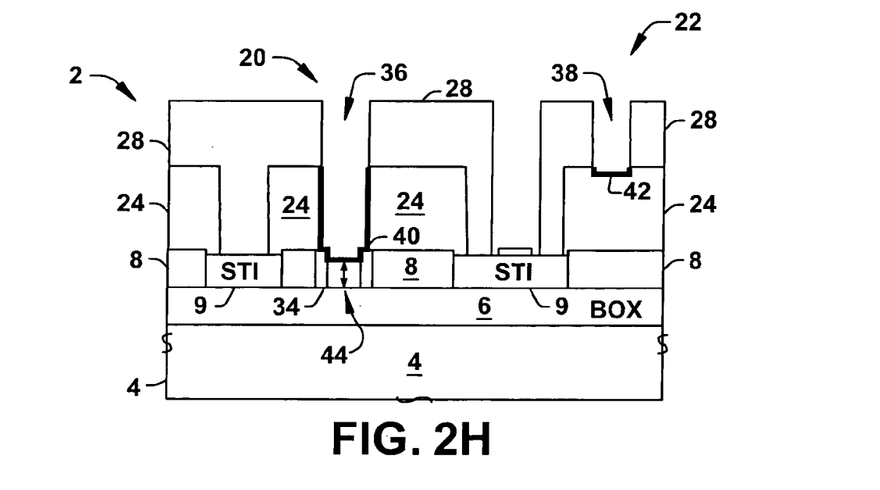
Figure 2I:
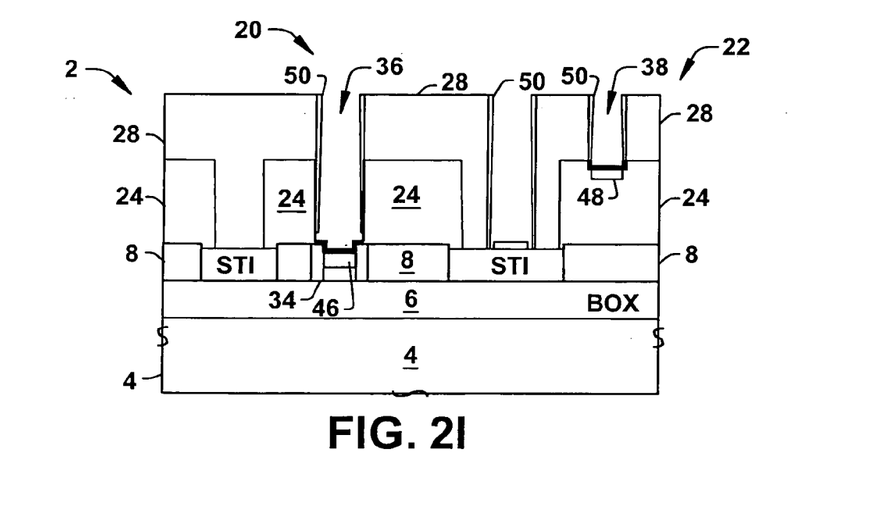
Figure 2J:
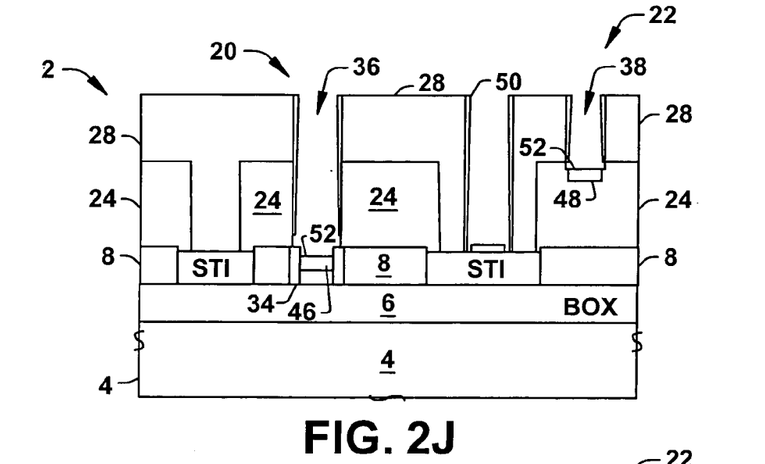
Figure 2K:
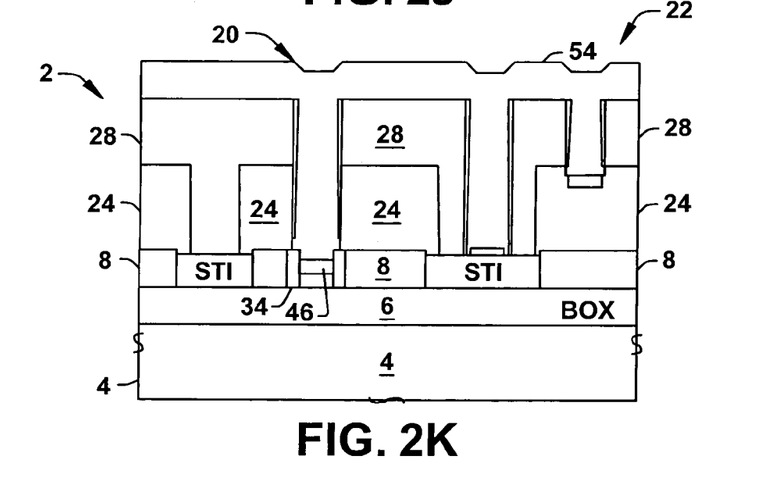
Figure 2L:
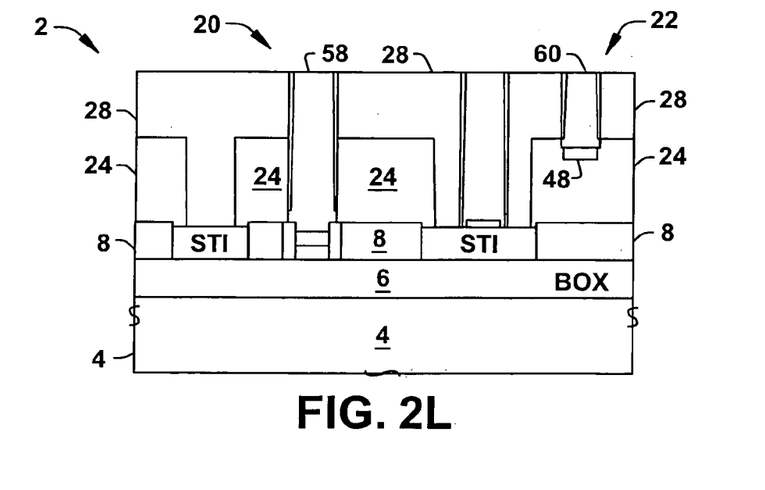
Figure 2M:
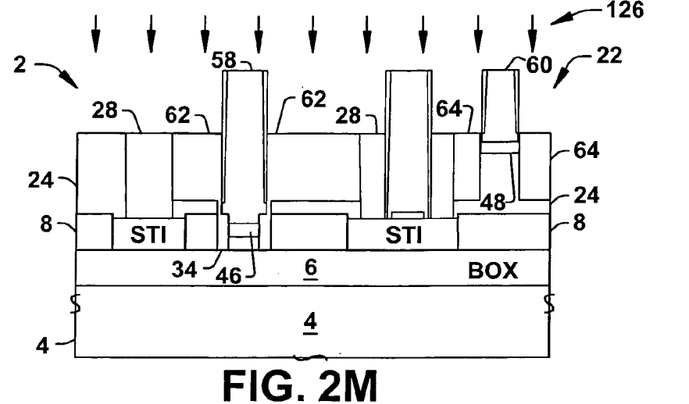
Figure 2N:
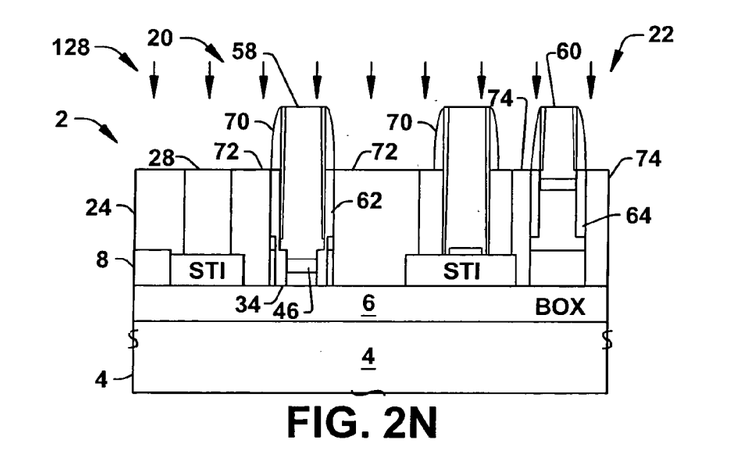
Figure 2O:
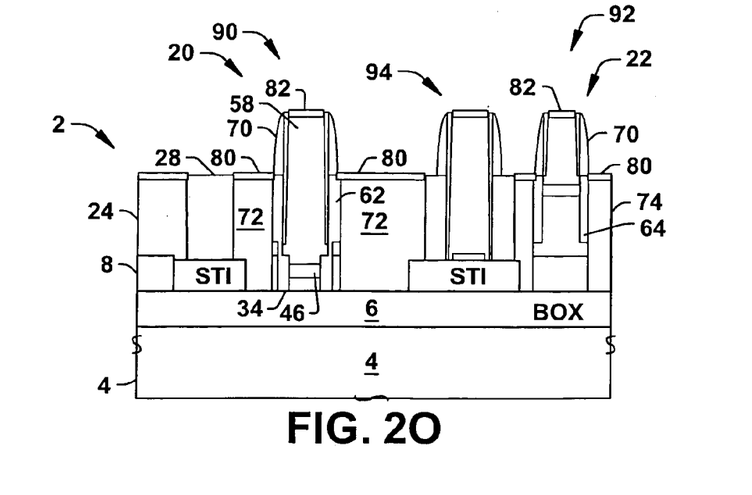

Referring initially to FIG. 1, FIG. 1 illustrates an exemplary method 100 in accordance with the invention, and FIGS. 2A–2O illustrate the exemplary device 2 above at various stages of fabrication processing. Although the method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods of the present invention may be implemented in association with the fabrication of various types of semiconductor devices, and any such device incorporating such a method is contemplated as falling within the scope of the present invention.

FIG. 1 illustrates an exemplary method 100 for fabricating PD-SOI and FD-SOI devices on the same die. The method 100 begins at 102, wherein isolation processing is performed at 104 in the SOI starting material, for example, comprising a silicon substrate 4 (FIG. 2A) having a buried oxide layer (BOX) 6 and a first silicon layer (sometimes referred to as the SOI layer) 8 having a thickness 10 (e.g., about 12 nm) lying thereover. In one example, the isolation processing 104 comprises shallow trench isolation (STI) features 9 formed in the first silicon layer 8 extending down to the buried oxide 6, however, other isolation structures such as field oxide may be employed and such alternative structures are contemplated as falling within the scope of the present invention.

The method 100 of FIG. 1 continues at 106, wherein an oxide layer 12 (e.g., a pad oxide) and a nitride layer 14 are deposited, and the nitride layer is patterned and etched using the underlying oxide as an etch stop, as illustrated in FIG. 2A. In one example, the oxide layer 12 has a thickness 16 of about 10 nm and the nitride layer 14 has a thickness 18 of about 80 nm, however, other dimensions and relative proportional sizing may be employed and are contemplated as falling within the scope of the present invention. In the example illustrated in FIG. 2A, one resultant nitride structure resides over the first silicon layer 8 in a fully-depleted region 20 of the device 2 and will later become the gate of the FD-SOI transistor, while another nitride structure results in a dummy structure overlying an STI isolation region 9 that separates the fully-depleted region from a partially-depleted region 22 and will later become a poly (or gate material) interconnect, as will be more fully appreciated infra.

Referring now to FIGS. 1 and 2B, an oxide etch process 108 is performed (e.g., a wet etch), wherein the oxide is removed in areas overlying the first silicon layer 8, except in regions underlying the patterned nitride structures 14, wherein recessed oxide structures 23 remain. As will be more fully appreciated below, the oxide structure 23 and the nitride structure 14 in the fully-depleted SOI region 20 will define a gate region for the fully-depleted SOI transistor to be formed thereat.

A selective epitaxial growth process is then performed at 110 in FIG. 1, resulting, in one example, in single crystal intrinsic silicon (a second silicon layer) 24 being formed (FIG. 2C) over the first silicon layer 8, wherein the first silicon layer and the second silicon layer 24 combine to form a composite silicon layer 26 in the partially-depleted region 22 having a thickness 28 (e.g., about 30 nm) that is generally associated with a body thickness of the partially-depleted SOI transistor to be formed thereat. The second silicon layer 24 surrounds the nitride structure 14 in the fully-depleted region 20, as illustrated in FIG. 2C and is used to reduce resistance which otherwise may limit the FD-SOI transistor performance. Note that the second silicon layer 24 does not grow on the dielectric STI structures 9, however, some lateral growth does occur horizontally as shown, however, such lateral growth is not necessarily drawn to scale.

An oxide deposition process is then performed at 112 of FIG. 1 using, for example, a chemical vapor deposition (CVD) process, followed by a planarization process such as chemical mechanical polishing (CMP), wherein the CMP stops on the nitride structures 14, thereby resulting in an oxide dielectric 28 with exposed nitride structures on a top surface thereof 29, as illustrated in FIG. 2D. The method 100 continues at 114, wherein the oxide 28 is selectively patterned to form an opening therein in the partially-depleted region 22. For example, as illustrated in FIG. 2E, an etch mask 30 such as a pattern photoresist is formed over the oxide 28, with an opening 32 therein corresponding to a subsequent gate electrode location for the partially-depleted SOI device in the partially-depleted region 22. Note that in FIG. 2E, some oxide 28 still remains at the bottom of the opening 32, such that the second silicon layer 24 thereunder is not exposed. The etch mask 30 is then removed, for example, using a wet or dry strip process.

Referring to FIGS. 1 and 2F, the nitride structures are etched away or otherwise removed at 116, thereby exposing the oxide recessed structures 23 overlying the first silicon layer 8 and STI 9, respectively, as illustrated. An extension region implant is further performed at 116, wherein the dopant is implanted into the exposed first silicon layer 8 in the fully-depleted region 20 down to about the buried oxide 6 to form extension regions 34 in the fully-depleted region 20. Note that the oxide 28 and the STI regions 9 serve as an implant mask elsewhere on the device 2, wherein no dopant in the present example reaches the second silicon layer 24 in the partially-depleted region 22.

The oxide structure 23 in the fully-depleted region 20 is then removed at 118 along with the remaining oxide in the partially-depleted opening 32 (Please note that this number change is on purpose. Since the first opening 32 does not expose the underlying silicon and the ultimate gate opening 38 goes all the way down to the silicon, I chose to give it a different reference numeral to highlight that difference), as illustrated in FIG. 2G, wherein the first silicon layer 8 and the second silicon layer 24 are exposed in the fully-depleted gate opening 36 and the partially-depleted gate opening 38, respectively. A sacrificial oxidation is then performed at 120, wherein, for example, the device 2 is exposed to oxygen in an elevated temperature chamber to induce thermal oxide growth of exposed silicon regions at the bottom of the gate openings 36 and 38, respectively, resulting in oxide regions 40 and 42, as illustrated in FIG. 2H. In accordance with one aspect of the present invention, an amount of oxide growth is controlled in order to tune an amount of silicon consumption in the fully-depleted gate opening 36 to thereby control the remaining thickness 44 of the silicon body therein. More particularly, the sacrificial oxidation 120 is performed for a time period sufficient to ensure sufficient consumption of the first silicon layer 8 in the opening 36 to ensure that upon device operation the resultant body thickness is fully depleted (i.e., achieving a fully-depleted SOI device in the fully-depleted region 20, in one example). A threshold voltage adjustment implant may then be performed through the sacrificial oxide regions 40 and 42 into the first silicon layer 8 and second silicon layer 24 in the fully-depleted region 20 and the partially-depleted region 22, respectively, thereby forming or defining channel regions 46 and 48 in what will be the body of the devices (see FIG. 2I). The threshold voltage adjustment implant may be patterned to implant different doses into the FD-SOI and PDSOI transistors if desired.

A sidewall nitride deposition then occurs at 122 of FIG. 1, for example, by depositing a substantially conformal nitride layer over the oxide 28 and then performing a substantially anisotropic etch thereof, wherein the nitride is removed from horizontal surfaces and remains on the vertical sidewalls within the gate openings 36 and 38, as well as on other substantially vertical surfaces, as illustrated in FIG. 2J at reference numeral 50. As will be further appreciated infra, the nitride sidewalls 50 serve to isolate the subsequently formed gate (formed in the gate openings 36 and 38) from the second silicon layer 24, particularly in the fully-depleted region 20.

The sacrificial oxide 40 and 42 is then removed using, for example, a wet etch, and a high quality gate oxide 52 is then formed in the gate openings 36 and 38 via, for example, thermal growth. Alternatively, other gate dielectric materials may be deposited (e.g., high-k dielectric materials), and such alternatives are contemplated as falling within the scope of the present invention. A conductive gate material, for example, in-situ doped polysilicon, is then formed in the gate openings 36 and 38 at 124 of FIG. 1 and over the oxide 28 using, for example, a CVD deposition process, as illustrated in FIG. 2K at reference numeral 54. Act 124 of FIG. 1 then concludes with a planarization process such as CMP, wherein the gate electrode material is removed down to the oxide layer 28, thereby exposing gate electrodes 58 and 60 at a top surface of the oxide 28 as illustrated in FIG. 2L.

Referring now to FIGS. 1 and 2M, a top portion of the oxide layer 28 is then removed at 126 using, for example, a wet or dry etch process, wherein the oxide 28 is removed down to a top surface of the second silicon layer 24, as illustrated in FIG. 2M, wherein the gate electrodes 58 and 60 of the fully-depleted and partially-depleted SOI devices extend above the oxide 28 and silicon 24 as mesa type structures. In the above manner, the second silicon layer 24 is exposed in both the fully-depleted and the partially-depleted regions 20 and 22, respectively. The act 126 of FIG. 1 then continues with an extension region implant into the second silicon layer 24, thereby forming extension regions 62 and 64, respectively, wherein the extension region 62 in the fully-depleted region 20 connects to the earlier formed extension region 34 as illustrated.

Sidewall spacers are then formed at 128 of FIG. 1, wherein such spacers may be single or multi-layer spacers, as may be appreciated, as illustrated in FIG. 2N at reference numeral 70. For example, the spacers 70 are formed by depositing one or multiple dielectric layers over a top surface of the device 2 in a generally conformal manner, followed by a substantially anisotropic etch thereof, thus leaving the one or more dielectric layers on the sidewalls of the gate structures 58 and 60, respectively. Since the sidewall nitride structures 50 already provide insulation for the gate electrodes 58 and 60, the sidewall spacers 70 provide a lateral masking of a subsequent source/drain implant at 128, wherein the resultant source/drain regions 72 and 74 are formed laterally offset from the gate electrodes 58 and 60 in the fully-depleted and partially-depleted regions 20 and 22, respectively. As illustrated in FIG. 2N, in the present example, the implant at 128 results in source/drain regions 72 and 74 that extend down to the buried oxide 6, however, variations in the extension regions 62, 64 and source/drain regions 72, 74 may be employed and are contemplated as falling within the scope of the present invention.

Referring again to FIG. 1, a silicidation process is performed at 130 to reduce contact resistance at the source/drains and gates of the SOI devices. On one example, the silicidation comprises depositing a conductive layer (e.g., cobalt or nickel) over the device 2 and performing a thermal process, wherein the conductive material reacts with underlying silicon to form a silicide. For example, as illustrated in FIG. 2O, the metal reacts with the source/drain regions to form source/drain silicide regions 80 and reacts with the gate poly to form gate silicide regions 82, respectively. The unreacted metal (e.g., covering the oxide 28 and spacers 70) is then stripped away, wherein the process 100 then concludes with back end processing at 132 such as metallization.

Thus the process 100 of the present invention results in a fully-depleted SOI device 90 in the fully-depleted region 20 and a partially-depleted SOI device 92 in the partially-depleted region 22, respectively. A dummy structure 94 is illustrated in the figures to show how gate material interconnect structures can be formed in conjunction with the process 100 over isolation such as the STI 9, however, such dummy structures will not affect the operation of the devices 90 and 92. Thus the isolation 9 effectively serves to isolate the fully-depleted regions 20 on the die from the partially-depleted regions 22.

In addition, the present invention contemplates the formation of both NMOS and PMOS type FD-SOI and PD-SOI devices, and all such variations thereof are also contemplated as falling within the scope of the present invention.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of forming fully-depleted and partially-depleted silicon-on-insulator (SOI) devices in an integrated circuit device, comprising:
    providing a first silicon layer over a buried oxide layer, wherein the silicon layer comprises a first thickness associated with a fully-depleted SOI device, the first silicon layer having a fully-depleted region and a partially-depleted region associated therewith;
    forming a dielectric portion over the first silicon layer in the fully-depleted region;
    forming a second silicon layer over the first silicon layer, thereby surrounding the dielectric portion in the fully-depleted region and forming a composite silicon layer comprising the first and second silicon layers in the partially-depleted region, wherein the composite silicon layer has a second thickness associated with a partially-depleted SOI device;
    forming a dielectric layer over the second silicon layer, thereby covering the composite silicon layer in the partially-depleted region and surrounding the dielectric portion in the fully-depleted region;
    removing the dielectric portion in the fully-depleted region and a portion of the dielectric layer in the partially-depleted region, thereby forming a fully-depleted gate opening and exposing a portion of the first silicon layer in the fully-depleted region and forming a partially-depleted gate opening and exposing a portion of the second silicon layer in the partially-depleted region;
    providing insulating material on sidewalls of the gate openings; and
    forming conductive material in the gate openings, thereby forming fully-depleted and partially-depleted gate electrodes therein, respectively, wherein a distance between a bottom of the fully-depleted gate electrode and the buried oxide layer is less than a distance between a bottom of the partially-depleted gate electrode and the buried oxide layer.

2. The method of claim 1, wherein the dielectric portion comprises a nitride material and the dielectric layer comprises an oxide material.

3. The method of claim 1, wherein forming the second silicon layer comprises performing a selective epitaxial deposition, wherein silicon grows on surfaces containing silicon and does not grow substantially on surfaces that do not contain silicon, whereby the second silicon layer does not grow on a top part of the dielectric portion.

4. The method of claim 1, wherein forming the dielectric layer comprises:
    depositing a dielectric material over the device; and
    planarizing the dielectric material until a top portion of the dielectric portion is exposed.

5. The method of claim 1, wherein removing the portion of the dielectric layer in the partially-depleted region comprises:
    forming a patterned photoresist or hardmask layer over the dielectric layer; and
    etching the dielectric layer using the patterned photoresist or hardmask layer as an etch mask down to the second silicon layer to form the partially-depleted gate opening.

6. The method of claim 5, wherein the dielectric layer comprises an oxide material and the dielectric portion comprises a nitride material, wherein removing the dielectric portion comprises etching the nitride material dielectric portion with an etchant that is substantially selective with respect to the oxide material.

7. The method of claim 1, further comprising:
    forming a sacrificial oxide layer in the fully-depleted gate opening, wherein the sacrificial oxide consumes a portion of the first silicon layer at the bottom of the fully-depleted gate opening; and
    removing the sacrificial oxide, thereby again exposing the first silicon layer at the bottom of the fully-depleted gate opening, wherein a remaining thickness of the first silicon layer below the fully-depleted gate opening is small enough to ensure fully depletion thereat during device operation.

8. The method of claim 1, further comprising forming a gate oxide at a bottom of the gate openings.

9. The method of claim 1, wherein providing insulating material on sidewalls of the gate openings comprises:
    depositing a nitride layer in a generally conformal manner over a remaining top portion of the dielectric layer and in the gate openings; and
    performing a substantially anisotropic etch of the nitride layer, thereby removing portions of the nitride layer on the top of the dielectric layer and at the bottom of the gate openings and leaving nitride material on the sidewalls of the gate openings.

10. The method of claim 1, wherein forming conductive material in the gate openings comprises:
    depositing a polysilicon layer over the dielectric layer and in the gate openings; and
    planarizing the polysilicon layer down to the top of the dielectric layer, thereby isolating the polysilicon in the gate openings.

11. The method of claim 1, further comprising:
    forming a pad oxide layer over the first silicon layer prior to forming the dielectric portion in the fully-depleted region; and
    performing a pad oxide etch after forming the dielectric portion thereover, wherein a remaining portion of the pad oxide is recessed under the dielectric portion.

12. The method of claim 11, wherein upon removing the dielectric portion in the fully-depleted region, the recessed pad oxide remains at the bottom of the fully-depleted gate opening, and further comprising performing an extension region implant into the fully-depleted gate opening, thereby forming extension regions in the first silicon layer below the fully-depleted gate opening having a spacing therebetween corresponding to a width of the recessed pad oxide.

13. The method of claim 12, further comprising:
removing the recessed pad oxide after the extension region implant; and
performing a threshold voltage adjust implant into the first silicon layer at the bottom of the fully-depleted gate opening and into the second silicon layer at the bottom of the partially-depleted gate opening.

14. The method of claim 1, further comprising:
removing a portion of the dielectric layer to a level to expose the underlying second silicon layer, thereby exposing the gate electrodes vertically extending therefrom;

performing an extension region implant into the second silicon material to form extension regions for the fully-depleted and partially-depleted devices;

forming sidewall spacers along sidewalls of the gate electrodes; and performing a source/drain implant into the second silicon material to form source/drain regions for the fully-depleted and partially-depleted devices spaced apart from the gate electrodes a distance corresponding to a width of the sidewall spacers.

* * * * *